US010223252B2

(12) United States Patent
Chang et al.

(10) Patent No.: US 10,223,252 B2
(45) Date of Patent: Mar. 5, 2019

(54) HYBRID DRAM ARRAY INCLUDING DISSIMILAR MEMORY CELLS

(71) Applicant: Samsung Electronics Co., Ltd., Suwon-si, Gyeonggi-do (KR)

(72) Inventors: Mu-Tien Chang, Santa Clara, CA (US); Dimin Niu, Sunnyvale, CA (US); Hongzhong Zheng, Los Gatos, CA (US)

(73) Assignee: Samsung Electronics Co., Ltd. (KR)

( * ) Notice: Subject to any disclaimer, the term of this patent is extended or adjusted under 35 U.S.C. 154(b) by 38 days.

(21) Appl. No.: 15/496,936

(22) Filed: Apr. 25, 2017

(65) Prior Publication Data
US 2018/0285253 A1 Oct. 4, 2018

Related U.S. Application Data

(60) Provisional application No. 62/480,097, filed on Mar. 31, 2017.

(51) Int. Cl.
*G06F 12/02* (2006.01)
*G11C 8/12* (2006.01)
*G11C 8/14* (2006.01)
*G11C 8/16* (2006.01)

(52) U.S. Cl.
CPC ............ *G06F 12/0207* (2013.01); *G11C 8/12* (2013.01); *G09G 2360/128* (2013.01); *G11C 8/14* (2013.01); *G11C 8/16* (2013.01)

(58) Field of Classification Search
CPC .................................................. G11C 11/005

USPC ..................................................... 365/185.11
See application file for complete search history.

(56) References Cited

U.S. PATENT DOCUMENTS

| 9,305,616 | B2 * | 4/2016 | Yu ......................... G11C 7/1072 |
| 9,472,248 | B2 * | 10/2016 | Wilkerson ........... G11C 7/1072 |
| 2005/0083721 | A1 * | 4/2005 | Hampel .................... G09G 5/39 365/145 |
| 2008/0104309 | A1 * | 5/2008 | Cheon ................. G06F 12/0246 711/103 |
| 2010/0115192 | A1 * | 5/2010 | Lee ...................... G06F 12/0246 711/103 |
| 2013/0128665 | A1 * | 5/2013 | Mokhlesi ............... G11C 16/04 365/185.09 |
| 2013/0163311 | A1 * | 6/2013 | Hanafusa .............. G11C 11/419 365/154 |
| 2014/0104951 | A1 * | 4/2014 | Sakui ................. G11C 16/0483 365/185.17 |
| 2016/0071577 | A1 * | 3/2016 | Menezes ............... G11C 11/419 365/154 |

(Continued)

*Primary Examiner* — Min Huang
(74) *Attorney, Agent, or Firm* — Innovation Counsel LLP

(57) ABSTRACT

A hybrid memory includes a plurality of tiles including a plurality of rows including a first row having a first type of memory cells and a second row having a second type of memory cells; a pair of bitline select signals including a bitline select signal and a bitline select bar signal that is an inverse of the bitline select signal; a wordline driver that is configured to receive an input data; a sense amplifier that is configured to output an output data; a write bitline coupled to the first row and the second row; a read bitline coupled to the first row and the second row; a wordline coupled to each of the plurality of rows; and a bitline that is coupled to the write bitline and the read bitline based on set values of the pair of bitline select signals.

20 Claims, 5 Drawing Sheets

(56) References Cited

U.S. PATENT DOCUMENTS

| | | |
|---|---|---|
| 2016/0118117 A1* | 4/2016 | Park .................. G11C 13/0069 365/148 |
| 2016/0172034 A1* | 6/2016 | Oh ........................ H03M 13/27 714/763 |
| 2016/0188464 A1 | 6/2016 | Bar-Or et al. |
| 2016/0343432 A1 | 11/2016 | Henze et al. |

* cited by examiner

HYBRID DRAM ARRAY INCLUDING DISSIMILAR MEMORY CELLS

CROSS-REFERENCE TO RELATED APPLICATION(S)

This application claims the benefits of and priority to U.S. Provisional Patent Application Ser. No. 62/480,097 filed on Mar. 31, 2017, the disclosure of which is incorporated herein by reference in its entirety.

TECHNICAL FIELD

The present disclosure relates generally to dynamic random-access memory (DRAM) arrays, more particularly, to a hybrid DRAM array including dissimilar memory cells.

BACKGROUND

In efforts to improve the performance of dynamic random-access memory (DRAM) over the past decades, great emphasis has been made to increase the density and bandwidth of the DRAM, but the latency of the DRAM has not been greatly improved.

A DRAM cell structure including a single transistor and a single capacitor, herein referred to as 1T1C, was introduced in 1968. The 1T1C cell structure accounts for the majority of today's off-chip DRAMs. The 1T1C cell structure has a high density but requires a destructive read operation to perform a write back to restore a cell charge, thereby increasing the latency to access 1T1C cells.

A DRAM cell structure including three transistors and a single capacitor, herein referred to as 3T1C, was introduced in 1970. The 3T1C cell structure accounts for numerous variants that are popularly used in today's embedded DRAMs (eDRAMs). The 3T1C cell structure has a low density but it does not require a write-back. The non-destructive read operation that does not require a write-back allows a faster read access time and saves approximately 7 ns or 15% of a row cycle time (tRC) compared to the 1T1C cell structure.

Based on a type of a DRAM array, a memory controller uses different timings to control an access to the DRAM array. Different types of DRAM arrays may be used for different applications. For example, an application requiring a high-density can take advantage of the 1T1C cell structure whereas an application that requires a fast performance may use 3T1C memory cells. Integration of dissimilar types of DRAM cells in a single DRAM array may provide a required density while meeting the performance requirement for an application.

SUMMARY

According to one embodiment, a hybrid memory includes a plurality of tiles including a plurality of rows including a first row having a first type of memory cells and a second row having a second type of memory cells; a pair of bitline select signals including a bitline select signal and a bitline select bar signal that is an inverse of the bitline select signal; a wordline driver that is configured to receive an input data; a sense amplifier that is configured to output an output data; a write bitline coupled to the first row and the second row; a read bitline coupled to the first row and the second row; a wordline coupled to each of the plurality of rows; and a bitline that is coupled to the write bitline and the read bitline based on set values of the pair of bitline select signals. A write data path is established from the wordline driver to the write bitline, and the input data driven by the wordline driver is written to a row selected from the plurality of rows based on the wordline. A read data path is established from either the write bitline or the read bitline to the bit line, and the output data that is read from a row selected from the plurality of rows based on the wordline.

According to another embodiment, a method of operating a hybrid memory includes: establishing a write data path from the wordline driver to the write bitline; selecting a row from the plurality of rows using the wordline; driving the input data using the wordline driver to write the input data to the selected row; establishing a read data path from either the write bitline or the read bitline to the bit line; selecting a row from the plurality of rows using the wordline; and reading the output data using the sense amplifier to read the output data from the selected row.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

Figure 1:
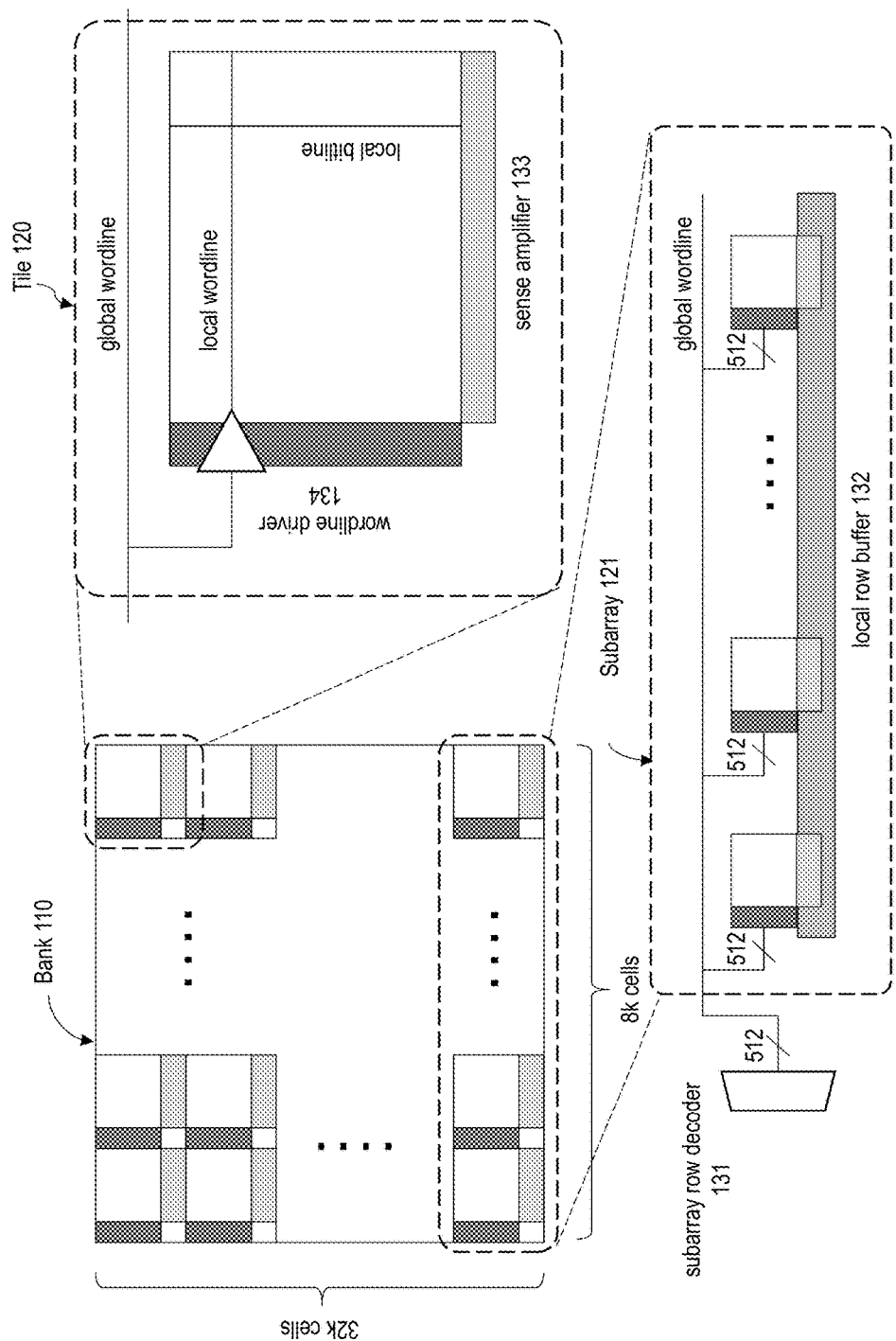
FIG. 1 illustrates an example hybrid bank configuration, according to one embodiment. A subarray can include all 1T1C cells or all 3T1C cells.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a hybrid DRAM array including dissimilar types of DRAM cells. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure provides a hybrid DRAM array (herein also referred to as a hybrid DRAM in short) that includes at least two dissimilar types of DRAM cells. The dissimilar types of DRAM cells can include a first type that has a high density and a second type that has a fast read access time. By having subarrays of mixed types of DRAM cells, the hybrid DRAM array can enjoy the benefits of the both types of the DRAM cells.

According to one embodiment, the present hybrid DRAM array has two regions including, a slow region having a high capacity and a fast region having a low capacity. The terms used herein "fast," "slow," high," and "low" may be used relative based on a type and characteristics of the DRAM cells in the context of the present hybrid DRAM array, and they do not mean to carry an absolute meaning for a speed and a capacity. For example, the slow region having the high capacity corresponds to one or more subarrays of one transistor and one capacitor (1T1C) DRAM cells. The fast region having the low capacity corresponds to one or more subarrays of three transistors and one capacitor (3T1C) DRAM cells.

According to one embodiment, the allocation and addresses of the slow region and the fast region of the present hybrid DRAM array are known to a memory controller and/or an operating system (OS) or an application running on a host computer. The OS or the application can map frequently-used pages to the fast region to achieve the speed of the 3T1C DRAM subarrays. The infrequently-used pages can be allocated to the slow region taking advantage of the high density of the 1T1C DRAM subarrays.

The present hybrid DRAM array can include a plurality of banks. Each of the banks can include a plurality of rows of tiles, herein also referred to as a subarray. Each row of tiles can include a plurality of hybrid tiles. Each hybrid tile can include a plurality of 1T1C cells and/or 3T1C cells.

According to one embodiment, the present hybrid DRAM array can be configured to include one or more hybrid banks or one or more hybrid tiles. Each of the hybrid banks can include the same type of DRAM cell subarrays, for example, all 1T1C subarrays or all 3T1C subarrays. The hybrid tile can include both the 1T1C cells and 3T1C cells that are connected to the same bitline with added peripheral circuitry, such as a bitline select, a bitline select bar that is an inverse of the bitline select, to a direct a data path to a selected row of DRAM cells.

According to one embodiment, two sets of DRAM-specific times are used. The first set times is used access 1T1C cells, herein referred to as an activate-to-precharge time (tRAS) and a row-cycle time (tRC). The second set of times is used to reflect the shorter latency for the 3T1C cell, herein referred to as tRAS_S and tRC_S. A memory controller that is configured to access the present hybrid DRAM array is aware of the address map of the cells, rows, subarrays, and banks of the present hybrid DRAM array. The memory controller can intelligently map the fast 3T1C DRAM subarrays for frequently-accessed data and the slow 1T1C DRAM subarrays region for the infrequently-accessed data. The memory controller can use the mapping information and apply different DRAM timings to achieve an overall better performance. The fast and slow memory regions are known to the host computer to allow the host computer to take advantage of the present hybrid DRAM array.

FIG. 1 illustrates an example hybrid bank configuration, according to one embodiment. The present hybrid DRAM array can include a plurality of hybrid banks. The hybrid bank 110 is a two-dimensional array of capacitor-based DRAM cells, for example, 1T1C cells and 3T1C cells. The hybrid bank 110 can include a plurality of rows, herein also referred to as subarrays, and each row can include a plurality of tiles. Each tile 120 can be a hybrid tile including a plurality of rows of 1T1C cells and/or 3T1C cells. In the present example, the hybrid bank 110 has 32 k rows, and each row has 8 k cells. However, this is only an example, and any sizes and configuration of banks, rows, subarrays, and tiles are possible to construct the hybrid bank 110.

A plurality of global bitlines spans the hybrid bank 110 in a column direction. An inverse of the global bitlines, herein referred to as global bit lines bar BL# may also span in the column direction. Each global bitline can connect a local bitline that connects a sense amplifier 133 to any of the cells in the same column. A global wordline that corresponds to each row (or subarray) determines that the corresponding row of cells is (or is not) connected to the bitlines.

The hybrid bank 110 is divided into a two-dimensional array of tiles 120. Each tile 120 includes a plurality of cells. For example, the tile 120 is an array of 512 cells by 512 cells. Each tile 120 has a plurality of sense amplifiers 133 and wordline drivers 134 that strength or amplify signals on the global wordlines before relaying the signals to the local wordlines. The sense amplifier 133 acts as a latch for the corresponding cell. All tiles 120 can share the same set of global wordlines and can be activated and precharged concurrently.

A row decoder 131 of a subarray 121 is driven by a shared global row address latch. The global row address latch holds a partially pre-decoded row address (from a global row decoder) and is routed by a global address bus to all subarray row decoders of the hybrid DRAM array. The subarrays of the hybrid bank 110 share a global row buffer that can be connected to any one of the local row buffers through a set of global bitlines. A global row buffer can be used to sense perturbations caused by the local row buffer 132 on the global bitlines and amplify the perturbations before relaying the perturbations to the wordline drivers 134. The global row buffer can shorten the time to drive signals on the global bitlines before relaying the signals onto the local row buffer 132, thereby significantly increasing the access latency to the cells in the subarray 121.

Figure 2:
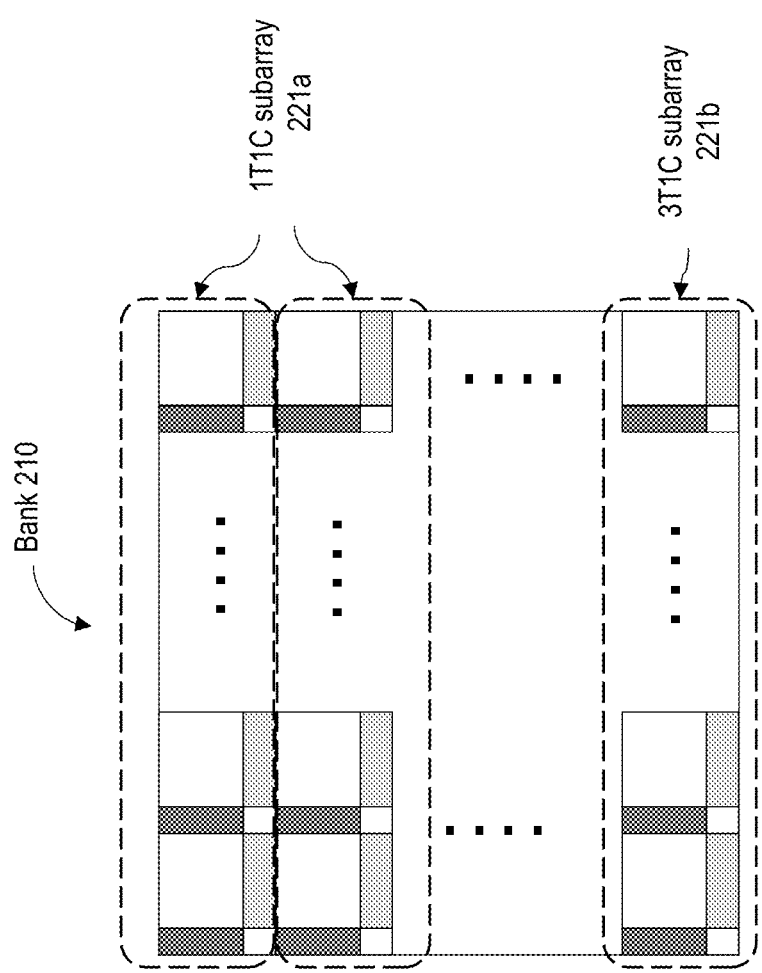
FIG. 2 illustrates an example hybrid bank including 1T1C DRAM subarrays and 3T1C DRAM subarrays, according to one embodiment.

FIG. 2 illustrates an example hybrid bank including 1T1C DRAM subarrays and 3T1C DRAM subarrays, according to one embodiment. In the present example, a first portion of the hybrid bank 210 includes one or more 1T1C DRAM subarrays 221a that can provide a high density, and a second portion of the DRAM subarrays includes one or more 3T1C DRAM subarrays 221b that can provide a fast access time. The division of the hybrid bank 210 into the first portion and the second portion can be determined based on several factors. Examples of the factors that determines the divisional portions of the hybrid bank 210 include, but are not limited to, the 1T1C density, the 3T1C density, a number of banks in the hybrid DRAM array, a number of subarrays in each bank, a number of tiles in each subarray, an application running on a host computer, an expected size of the data that needs to be accessed with a short latency, etc.

Figure 3:
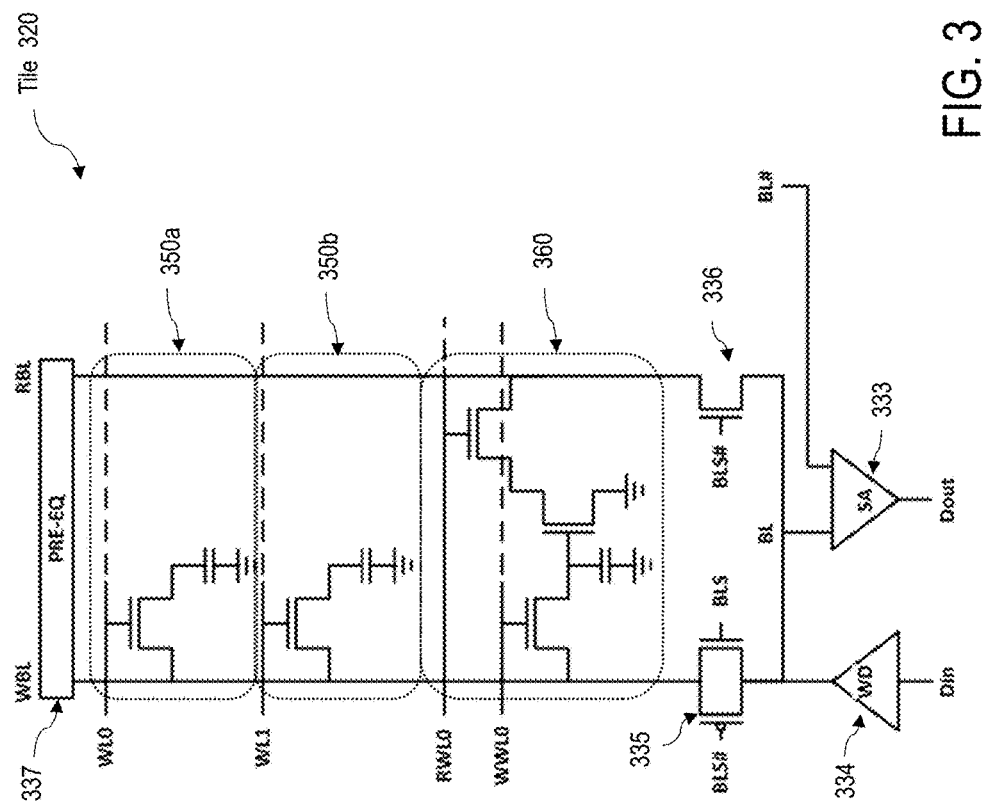
FIG. 3 shows illustrates an example hybrid tile configuration, according to one embodiment.

FIG. 3 shows illustrates an example hybrid tile configuration according to one embodiment. The hybrid tile 320 is an array of DRAM cells. For example, the hybrid tile 320 has an array of 512 rows, and each row has 512 cells. The hybrid tile 320 has a sense amplifier 333 and a write driver 334 that can strength signals on a global bitline before relaying the signals to a local bitline corresponding to the hybrid tile 320. The sense amplifier 333 acts as a latch for the corresponding cells.

In the present example, the hybrid tile 320 is shown to include 1T1C rows 350a and 350b and a 3T1C row 360. However, it is noted that the number of 1T1C cells and the number of 3T1C cells included in the hybrid tile 320 may change depending on the configuration of the hybrid tile 320 and other design and operating parameters that can optimize the performance of the hybrid tile 320.

The write driver 334 drives an input data signal Din on the global bitline. The output of the write driver 334 is connected to a pair of bitline select signals including a bitline select BLS and a bitline select bar BLS#. The bitline select bar BLS# can be a logical inverse signal of the bitline select BLS. Depending on the set values on the bitline select BLS and bitline select bar BLS#, different data paths can be established.

For a write operation, the bitline select BLS is set to be high and the bitline select bar BLS# is set to be low to establish a write data path from the write driver 334 to a write bitline WBL. A row to write the input data signal Din can be selected using a wordline WL (e.g., WL0 and WL1) for the 1T1C rows 350a and 350b and a write wordline (e.g., WWL0) for the 3T1C row 360.

For a read operation to 1T1C cells, the bitline select BLS is set to be high and the bitline select bar BLS# is set to be low to establish a first read data path from the write bitline WBL to the bitline BL. For a read operation to 3T1C cells, the bitline select BLS is set to be low and the bitline select bar BLS# is set to be high to establish a second read data path from the read bitline RBL to the bitline BL. According to one embodiment, the RBL is connected only to the 3T1C cells. For example, the bitline select bar BLS# is fed to an input node to a pass transistor 335 and a gate of a pass transistor 336 to establish an appropriate read data path based on the type of the selected row. A row to read the data can be selected using the wordline WL (e.g., WL0 and WL1) for the 1T1C rows 350a and 350b and a read wordline (e.g., RWL0) for the 3T1C row 360. The data signal that is read from the selected row appears on the bitline BL, and the data signal is amplified by the sense amplifier 333 using the bitline bar BL# as a reference and is output on the output data signal Dout.

The write bitline WBL and the read bitline RBL are connected to a precharge and equalization circuit 337 for precharging the bitlines WBL and RBL to a particular value. As used herein, "precharge" defines the charging of a node (or bitline) to a specified voltage level and "equalization" defines a process of sharing a charge between two nodes (or bitlines) to insure an equal voltage level therebetween.

Figure 4:
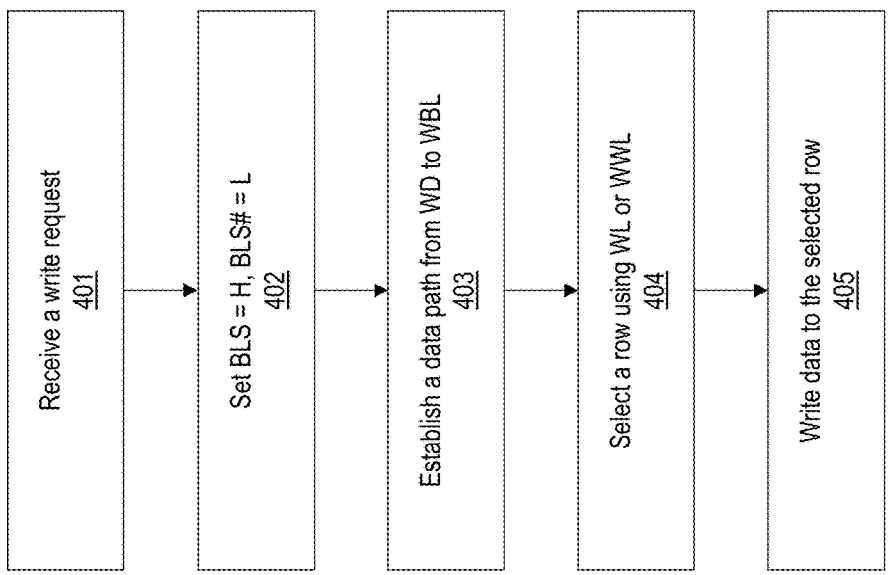
FIG. 4 is an example flowchart for a write operation to the present hybrid DRAM array, according to one embodiment.

FIG. 4 is an example flowchart for a write operation to the present hybrid DRAM array, according to one embodiment. A memory controller receives a write request from a host computer (e.g., an operating system or an application running on the host computer) (401). The bitline select BLS is set to be high, and the bitline select bar BLS# is set to be low (402). This establishes a data path from the write driver WD to the write bitline WBL (403). The wordline WL or the write wordline WWL is selected based on a row address of the selected row (404). The memory controller writes data to the cells of the selected row by sending the input data signal Din via the established data path from the write driver WD to the write bitline WBL (405).

Figure 5:
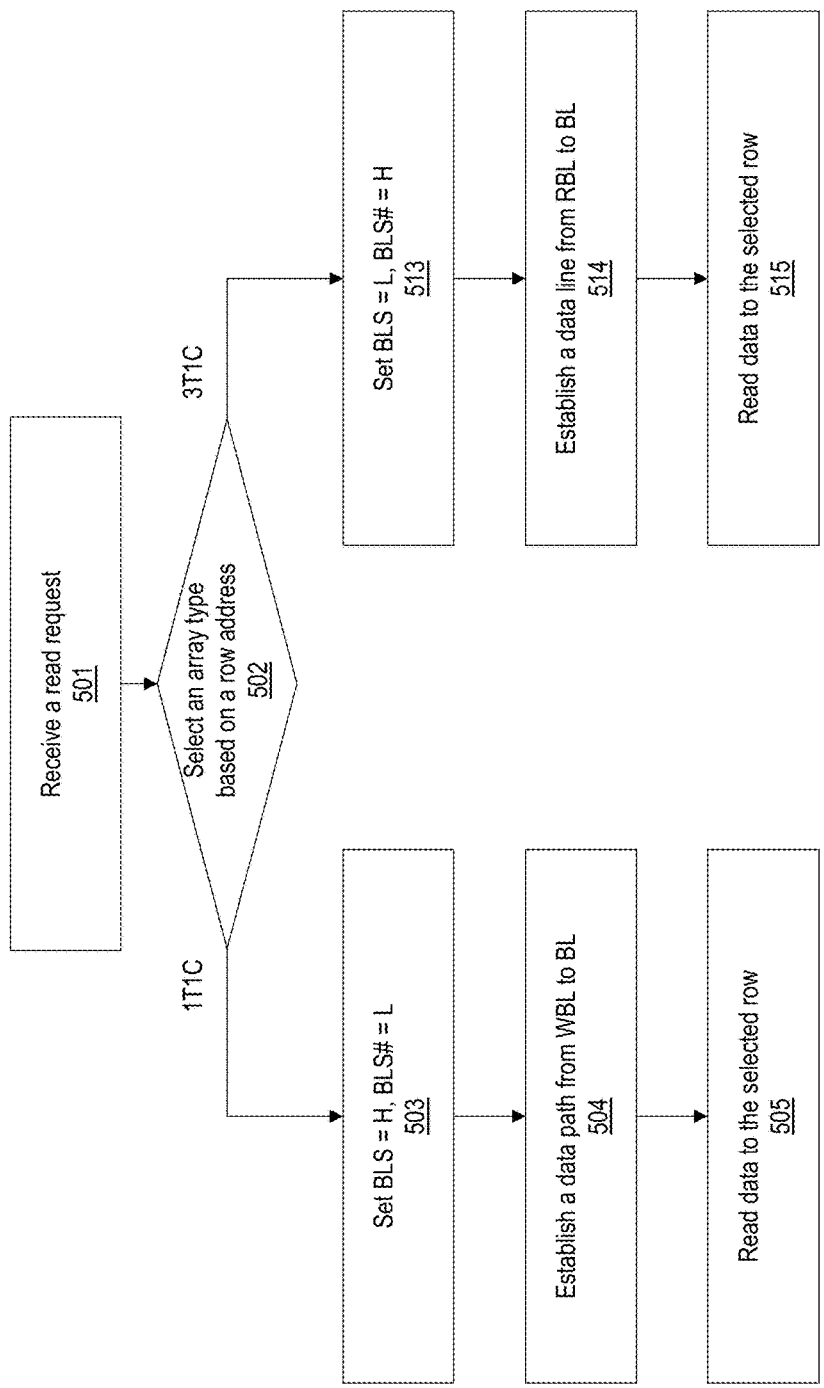
FIG. 5 is an example flowchart for a read operation to the present hybrid DRAM array, according to one embodiment.

FIG. 5 is an example flowchart for a read operation to the present hybrid DRAM array, according to one embodiment. A memory controller receives a read request from the host computer (e.g., an operating system or an application running on the host computer) (501). The memory controller determines an array type of the hybrid DRAM array based on a row address (502). If the row address is directed to a 1T1C row, the bitline select BLS is set to be high and the bitline select bar BLS# is set to be low (503). A data path is established from the write bitline WBL to the bitline BL (504). Although the write bitline WBL is used for write operations as the term "write" implies, the write bitline WBL can also be used for read operations. The memory controller reads data from the cells of the selected row (505). If the row address is directed to a 3T1C row, the bitline select BLS is set to be high and the bitline select bar BLS# is set to be low (513). A data path is established from the read bitline RBL to the bitline BL (514). The memory controller reads the data from the cells of the selected row (515).

Several design considerations can be taken into in configuring the present hybrid DRAM array. For example, a p-channel metal-oxide semiconductor (pMOS) transistor can be used for the bitline select bar BLS# to drive the write bitline WBL to a full Vdd. The write bitline WBL can precharge a half-Vdd, and the read bitline RBL can precharge to a full Vdd. Referring to FIG. 3, the bitline bar BL# is a mirrored column of the bitline BL. Since the bitline bar BL# acts as a reference voltage for a sensing amplifier, the bitline bar BL# selects the same write bitline WBL or the same read bitline RBL. The write bitline WBL and the read bitline RBL can have their own prefetch/equalizer circuit. A column of cells (e.g., WBL0) and another column of cells (e.g., WBL1) can have a shared prefetch/equalizer circuit such that the equalization can be done between the two write bitlines. Because the write bitline WBL is used for both 1T1C and 3T1C cells whereas the read bitline RBL is used only for 3T1C cells, the read bitline RBL can be shorter than the write bitline WBL, a read access to a 3T1C row that utilizes the read bitline RBL can be faster that a read access to a 1T1C row that utilizes the write bitline WBL. According to one embodiment, the 3T1C rows are disposed to be close to the sense amplifier, and the 1T1C rows are disposed away from the sense amplifier.

According to one embodiment, the present hybrid DRAM array takes advantage of the fast access speed to the 3T1C subarrays, and new timings for tRAS and tRC are used to access the 3T1C subarrays. The normal tRAS and tRC can be used for 1T1C, and short timings tRAS_S and tRC_S that correspond to the normal tRAS and tRC can be used for the 3T1C subarrays. When the memory controller accesses the 1T1C subarrays, the memory controller uses the normal tRAS and tRC based on their row address that are known to the memory controller. When the memory controller accesses the 3T1C rows, the memory controller uses the short timings tRAS_S and tRC_S instead.

According to one embodiment, the present hybrid DRAM array can have a hybrid bank configuration or a hybrid tile configuration. The hybrid bank configuration is a simple, homogeneous and has a tight layout; the peripherals are easier to optimize, and the write bitlines and read bitlines can be easily implemented as folded bitlines. However, the hybrid bank configuration is difficult for an open bitline organization. For example, the folded bitline can have a 8F^2 density and the open bitline can have a 6F^2 density. In contrast, the hybrid tile configuration is complex, but it works for both folded and open bitline organizations.

According to one embodiment, a hybrid memory includes a plurality of tiles including a plurality of rows including a first row having a first type of memory cells and a second row having a second type of memory cells; a pair of bitline select signals including a bitline select signal and a bitline select bar signal that is an inverse of the bitline select signal; a wordline driver that is configured to receive an input data; a sense amplifier that is configured to output an output data; a write bitline coupled to the first row and the second row; a read bitline coupled to the first row and the second row; a wordline coupled to each of the plurality of rows; and a bitline that is coupled to the write bitline and the read bitline based on set values of the pair of bitline select signals. A write data path is established from the wordline driver to the write bitline, and the input data driven by the wordline driver is written to a row selected from the plurality of rows based on the wordline. A read data path is established from either the write bitline or the read bitline to the bit line, and the output data that is read from a row selected from the plurality of rows based on the wordline.

The first type of memory cells may provide a high density, and the second type of memory cells may provide a fast access speed.

The read bitline may be shorter than the write bitline.

A memory controller for controlling an access to the hybrid memory may apply different timings to access the first row having the first type of memory cells and the second row having the second type of memory cells.

A timing to access the second row may be shorter than a timing to access the first row.

The first type of memory cells may be a one-transistor one-capacitor (1T1C) memory cells, and the second type of memory cells may be a three-transistor one capacitor (3T1C) memory cells.

The hybrid memory array may include a plurality of subarrays including a first subarray having the first type of memory cells a second subarray having the second type of memory cells.

A number of rows having the 1T1C memory cells may be greater than a number of rows having the 3T1C memory cells.

The 3T1C memory cells may be disposed to be close to the sense amplifier.

The write bitline and the read bitline may be coupled to a precharger.

According to another embodiment, a method of operating a hybrid memory includes: establishing a write data path from the wordline driver to the write bitline; selecting a row from the plurality of rows using the wordline; driving the input data using the wordline driver to write the input data to the selected row; establishing a read data path from either the write bitline or the read bitline to the bit line; selecting a row from the plurality of rows using the wordline; and reading the output data using the sense amplifier to read the output data from the selected row.

The first type of memory cells may provide a high density, and the second type of memory cells may provide a fast access speed.

The read bitline may be shorter than the write bitline.

The method may further include applying different timings to access the first row having the first type of memory cells and the second row having the second type of memory cells.

A timing to access the second row may be shorter than a timing to access the first row.

The first type of memory cells may be a one-transistor one-capacitor (1T1C) memory cells, and the second type of memory cells may be a three-transistor one capacitor (3T1C) memory cells.

The hybrid memory array may include a plurality of subarrays including a first subarray having the first type of memory cells and a second subarray having the second type of memory cells.

A number of rows having the 1T1C memory cells may be greater than a number of rows having the 3T1C memory cells.

The 3T1C memory cells may be disposed to be close to the sense amplifier.

The method may further include coupling the write bitline and the read bitline to a precharger.

The above example embodiments have been described hereinabove to illustrate various embodiments of implementing a system and method for providing a hybrid DRAM array including dissimilar types of DRAM cells. Various modifications and departures from the disclosed example embodiments will occur to those having ordinary skill in the art. The subject matter that is intended to be within the scope of the invention is set forth in the following claims.

What is claimed is:

1. A hybrid memory comprising:
    a plurality of tiles including a plurality of rows including a first row having a first type of memory cells and a second row having a second type of memory cells, wherein the first type of memory cells and the second type of memory cells have different cell structures, and wherein one or more of the first type of memory cells and one or more of the second type of memory cells are volatile memory cells;
    a pair of bitline select signals including a bitline select signal and a bitline select bar signal that is an inverse of the bitline select signal;
    a wordline driver that is configured to receive an input data;
    a sense amplifier that is configured to output an output data;
    a write bitline coupled to the first row and the second row;
    a read bitline coupled to the first row and the second row;
    a wordline coupled to each of the plurality of rows; and
    a bitline that is coupled to the write bitline and the read bitline based on set values of the pair of bitline select signals,
    wherein a write data path is established from the wordline driver to the write bitline, and the input data driven by the wordline driver is written to a row selected from the plurality of rows based on the wordline, and
    wherein a read data path is established from either the write bitline or the read bitline to the bit line, and the output data that is read from a row selected from the plurality of rows based on the wordline.

2. The hybrid memory of claim 1, wherein the first type of memory cells provides a high density, and the second type of memory cells provides a fast access speed.

3. The hybrid memory of claim 2, wherein the read bitline is shorter than the write bitline.

4. The hybrid memory of claim 2, wherein a memory controller for controlling an access to the hybrid memory applies different timings to access the first row having the first type of memory cells and the second row having the second type of memory cells.

5. The hybrid memory of claim 4, wherein a timing to access the second row is shorter than a timing to access the first row.

6. The hybrid memory of claim 2, wherein the first type of memory cells is a one-transistor one-capacitor (1T1C) memory cells, and the second type of memory cells is a three-transistor one capacitor (3T1C) memory cells.

7. The hybrid memory of claim 6, wherein the hybrid memory array comprises a plurality of subarrays including a first subarray having the first type of memory cells and a second subarray having the second type of memory cells.

8. The hybrid memory of claim 6, wherein a number of rows having the 1T1C memory cells is greater than a number of rows having the 3T1C memory cells.

9. The hybrid memory of claim 6, wherein the 3T1C memory cells are disposed to be close to the sense amplifier.

10. The hybrid memory of claim 1, wherein the write bitline and the read bitline are coupled to a precharger.

11. A method of operating a hybrid memory, wherein the hybrid memory comprises:
    a plurality of tiles including a plurality of rows including a first row having a first type of memory cells and a second row having a second type of memory cells, wherein the first type of memory cells and the second type of memory cells have different cell structures, and wherein one or more of the first type of memory cells and one or more of the second type of memory cells are volatile memory cells;
    a pair of bitline select signals including a bitline select signal and a bitline select bar signal that is an inverse of the bitline select signal;
    a wordline driver that is configured to receive an input data;
    a sense amplifier that is configured to output an output data;
    a write bitline coupled to the first row and the second row;
    a read bitline coupled to the first row and the second row;
    a wordline coupled to each of the plurality of rows; and
    a bitline that is coupled to the write bitline and the read bitline based on set values of the pair of bitline select signals,
    wherein the method comprises:
    establishing a write data path from the wordline driver to the write bitline;
    selecting a row from the plurality of rows using the wordline;
    driving the input data using the wordline driver to write the input data to the selected row;
    establishing a read data path from either the write bitline or the read bitline to the bit line;
    selecting a row from the plurality of rows using the wordline; and
    reading the output data using the sense amplifier to read the output data from the selected row.

12. The method of claim 11, wherein the first type of memory cells provides a high density, and the second type of memory cells provides a fast access speed.

13. The method of claim 12, wherein the read bitline is shorter than the write bitline.

14. The method of claim 12, further comprising applying different timings to access the first row having the first type of memory cells and the second row having the second type of memory cells.

15. The method of claim 14, wherein a timing to access the second row is shorter than a timing to access the first row.

16. The method of claim 12, wherein the first type of memory cells is a one-transistor one-capacitor (1T1C) memory cells, and the second type of memory cells is a three-transistor one capacitor (3T1C) memory cells.

17. The method of claim 16, wherein the hybrid memory array comprises a plurality of subarrays including a first subarray having the first type of memory cells and a second subarray having the second type of memory cells.

18. The method of claim 16, wherein a number of rows having the 1T1C memory cells is greater than a number of rows having the 3T1C memory cells.

19. The method of claim 16, wherein the 3T1C memory cells are disposed to be close to the sense amplifier.

20. The method of claim 11, further comprising coupling the write bitline and the read bitline to a precharger.

\* \* \* \* \*